(12) United States Patent
Clark et al.

(10) Patent No.: US 12,213,264 B2
(45) Date of Patent: *Jan. 28, 2025

(54) SERVER INFORMATION HANDLING SYSTEM SECURITY BEZEL

(71) Applicant: Dell Products L.P., Round Rock, TX (US)

(72) Inventors: Peter T. Clark, Taipei (TW); Amrita Sidhu Maguire, Cedar Park, TX (US); Richard W. Guzman, Austin, TX (US); Sean P. O'Donnell, Poughkeepsie, NY (US); Matthew B. Gilbert, Austin, TX (US); Georg Todtenbier, Taipei (TW); Oscar Coutinho, Taipei (TW); Yung-Chun Chen, Hsinchu (TW); Ming-Chiao Lee, Taoyuan (TW); Chi-Sung Chang, New Taipei (TW)

(73) Assignee: Dell Products L.P., Round Rock, TX (US)

( * ) Notice: Subject to any disclaimer, the term of this patent is extended or adjusted under 35 U.S.C. 154(b) by 86 days.

This patent is subject to a terminal disclaimer.

(21) Appl. No.: 17/512,005

(22) Filed: Oct. 27, 2021

(65) Prior Publication Data

US 2023/0129135 A1 Apr. 27, 2023

(51) Int. Cl.
*H05K 5/02* (2006.01)
*H05K 7/14* (2006.01)

(52) U.S. Cl.
CPC ......... *H05K 5/0204* (2013.01); *H05K 5/0213* (2013.01); *H05K 5/0221* (2013.01); *H05K 5/0247* (2013.01); *H05K 7/1405* (2013.01)

(58) Field of Classification Search
CPC .. H05K 5/0204; H05K 5/0213; H05K 5/0221; H05K 5/0247; H05K 7/1405
See application file for complete search history.

(56) References Cited

U.S. PATENT DOCUMENTS

| | | | |
|---|---|---|---|
| 5,673,029 A * | 9/1997 | Behl | .................... G11B 33/142 |
| 6,319,116 B1 * | 11/2001 | Behl | .................. H05K 7/20581 |
| 6,676,505 B2 * | 1/2004 | Behl | .................... G11B 33/148 |
| 7,042,721 B2 | 5/2006 | Olesiewicz et al. | |
| 7,054,144 B2 * | 5/2006 | Heistand, II | ............ G06F 1/184 |
| | | | 361/725 |
| 7,224,581 B2 | 5/2007 | Garnett et al. | |

(Continued)

*Primary Examiner* — Abhishek M Rathod
(74) *Attorney, Agent, or Firm* — Zagorin Cave LLP; Robert W. Holland

(57) ABSTRACT

A server information handling system is secured by a bezel that couples to an access location, such as an air vent at a front or rear face of a housing. The bezel includes a security structure having a lock and configured to couple directly at the front face or with a bezel extension at the rear face so that the server information handling system can use the same bezel with both a front face or rear face rack mount. The bezel has a lock integrated with the security structure, an air filter that fits over the security structure to filter air flowing into the housing, and a filter brace that captures the air filter by coupling to the security structure over the air filter. The filter brace attaches and detaches at the security structure when the security structure locks a server information handling system housing so that the air filter can be changed while the housing remains secure.

10 Claims, 11 Drawing Sheets

(56) References Cited

U.S. PATENT DOCUMENTS

| | | | |
|---|---|---|---|
| 7,499,275 B2* | 3/2009 | Lai | H05K 7/20181 |
| | | | 361/695 |
| RE41,514 E * | 8/2010 | Behl | H05K 7/20181 |
| | | | 312/223.1 |
| 7,898,804 B2 | 3/2011 | Olesiewicz et al. | |
| 9,149,753 B2 | 10/2015 | Wang | |
| 9,538,682 B1* | 1/2017 | Good | H05K 7/14 |
| 9,668,375 B2 | 5/2017 | Totani et al. | |
| 9,775,262 B1* | 9/2017 | Hsieh | H05K 5/0208 |
| 9,915,085 B2* | 3/2018 | Strmiska | H05K 7/1489 |
| 10,251,299 B1* | 4/2019 | Wang | E05C 9/026 |
| 10,324,503 B1* | 6/2019 | O'Donnell | H05K 9/0062 |
| 10,372,174 B2* | 8/2019 | Baum | H05K 7/16 |
| 10,788,868 B1* | 9/2020 | Crisp | G06F 1/206 |
| 11,096,307 B2* | 8/2021 | Sassano | H05K 5/0226 |
| 11,337,317 B2* | 5/2022 | Yang | H05K 5/0213 |
| 11,395,419 B2* | 7/2022 | Chen | H05K 5/0213 |
| 11,395,437 B2* | 7/2022 | Quijano | H05K 7/20181 |
| 11,525,590 B2* | 12/2022 | Chen | H05K 7/20145 |
| 11,603,007 B1* | 3/2023 | Castle | G06Q 20/14 |
| 11,800,693 B1* | 10/2023 | Sampath | H05K 7/20736 |
| 2008/0265723 A1 | 10/2008 | Kerrigan et al. | |
| 2009/0021910 A1* | 1/2009 | Lai | H05K 7/20181 |
| | | | 361/695 |
| 2011/0279973 A1* | 11/2011 | Terwilliger | H05K 7/1489 |
| | | | 312/223.2 |
| 2017/0017262 A1* | 1/2017 | Hartman | H05K 7/1498 |
| 2019/0050030 A1* | 2/2019 | Baum | H05K 7/1487 |
| 2019/0090382 A1* | 3/2019 | Cho | G06F 1/20 |
| 2020/0333856 A1* | 10/2020 | Quijano | G11B 33/146 |
| 2023/0016870 A1* | 1/2023 | Deng | B01D 69/02 |

* cited by examiner

SERVER INFORMATION HANDLING SYSTEM SECURITY BEZEL

BACKGROUND OF THE INVENTION

Field of the Invention

The present invention relates in general to the field of server information handling systems, and more particularly to a server information handling system security bezel.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Server information handling system interface which a network, such as the Internet, to communicate information through the network with client information handling systems and other server information handling systems. Often server information handling systems operate from a data center that maintains power and thermal conditions favorable to server operations so that network information connectivity remains reliable. A typical data center has a physically secure location with extensive cooling equipment to ensure that the server information handling systems can operate with full efficiency without exceeding thermal constraints. For instance, racks of plural server information handling systems face a cool air source at one side, draw the cool air with fans through each server information handling system, then exhaust heated air out the other side. Often cooling vents are located in the data center floor to direct cool air up at one side of information handling systems deployed in a rack and an HVAC intake pulls the heated air at the opposite side for treatment.

In addition to physical security provided by a data center, some information handling systems also have a secure bezel attached to their housing to restrict access to the housing interior. For example a bezel couples to the front side of the housing with a lock that prevents unauthorized access to within the housing interior. Often server information handling systems have flexible configurations to adapt to particular network needs, including different types of processing components with varying capability and thermal characteristics and different amounts of internal storage, such as different numbers and types of hard disk drives and solid state drives. In some instances, such as where a server information handling system is configured to have a short depth, the server information handling system may have to assemble into the server rack as a hot-aisle/rear accessed or cold-aisle/front accessed. When a server information handling system mounts in a rack with a rear access versus front access, different types of bezels are generally needed. For instance, the rear of the information handling system typically has ports and cables disposed around the cooling airflow vents that impact how a bezel can couple to the rear side and maintain system security. Designing and manufacturing bezels for both the front and rear sides increases system cost and complexity.

In some instances, server information handling systems include an air filter to help remove impurities from cooling airflow and protect the housing interior from damage by air borne particles. A difficulty with such air filters is that their efficacy at removal of impurities is reduced if the air filters are not replaced regularly with clean filters. Air filter replacement is often hindered by complex bezel designs that require service technicians to unlock, detach and disassembled the bezel before the filter can be replaced. As a result, air filters are often left installed for too long of a period of time, which increases the load on cooling fans and can result in increased thermal conditions within the housing interior and throttling of system performance to maintain thermal constraints.

SUMMARY OF THE INVENTION

Therefore, a need has arisen for a system and method which provides a bezel to secure a server information handling system at either a front side or rear side.

A further need exists for a system and method which replaces an information handling system air filter without removal of a secure bezel.

In accordance with the present invention, a system and method are provided which substantially reduce the disadvantages and problems associated with previous methods and systems of securing a server information handling system. A server information handling system bezel couples directly to the server information handling system at a first end and to a bezel extension at a second end so that the same bezel secures against access to the server information handling system whether mounted in a rack with the front or rear side exposed. A filter brace couples to the bezel security structure to detach and attach with the bezel locked to replace an air filter captured by the filter brace against the security structure.

More specifically, a server information handling system processes information with processing components disposed in a housing, such as a central processing unit that executes instructions to process information and a random access memory that stores the instructions and information. A cooling airflow passes through the housing between a front side having a planar vent and a rear side having cables that interface with power and networking resources. A bezel having a security structure, an air filter and a filter brace couples to the one of the front and rear faces exposed as an access location to the server information handling system housing interior and secures against access to the interior with a lock. When the front face is exposed as the access location, the bezel couples directly to the front face. When the rear face is exposed as the access location, the bezel couples to the rear face at a bezel extension that has a cavity with space to secure the cables extending from the rear face. The bezel extension couples to the rear face with a coupling device accessed from the interior so that the bezel secures against access to the bezel extension for release of the bezel extension. The air filter is replaced while the bezel security structure remains locked at the front or rear face by detaching and then reattaching the filter brace.

The present invention provides a number of important technical advantages. One example of an important technical advantage is that a server information handling system is secured by a common bezel coupled to either of a front or rear end that is exposed at a server rack. Having server security provided by the same bezel reduces costs and improves installation flexibility by supporting either the front or rear end of the server as the cold-exposed face in a rack. Replacement of the air filter at the bezel exterior without accessing the server interior improves serviceability to encourage air filter replacement by reducing the need to have security access to perform air filter maintenance. Further, coupling a bezel in place to secure the server and coupling the filter brace in place to support the air filter are each performed in a tool-less manner. Air filter maintenance may be performed by less qualified technicians who will lack access to more sensitive portions of the server as the bezel remains secured in place during filter replacement.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

A server information handling system bezel secures access to the server at either a front or rear face exposed as an access location. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1A:
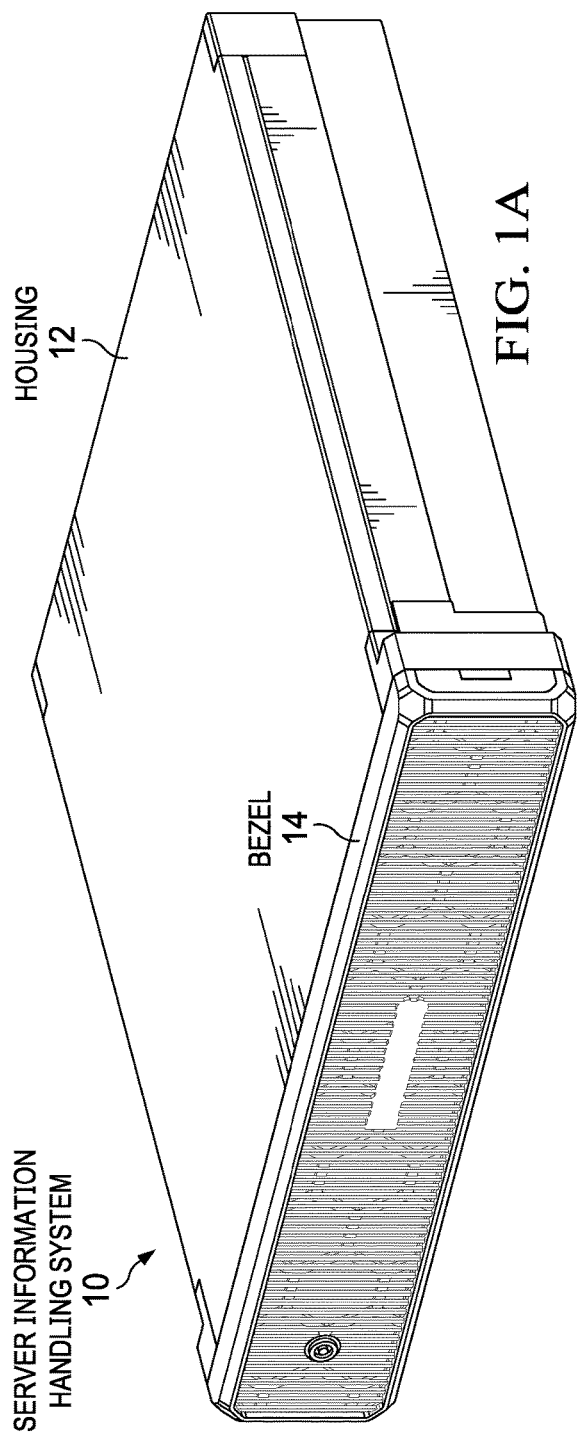
FIGS. 1A and 1B depict a server information handling system having a bezel that secures either a front or rear face of the housing.
Figure 1B:
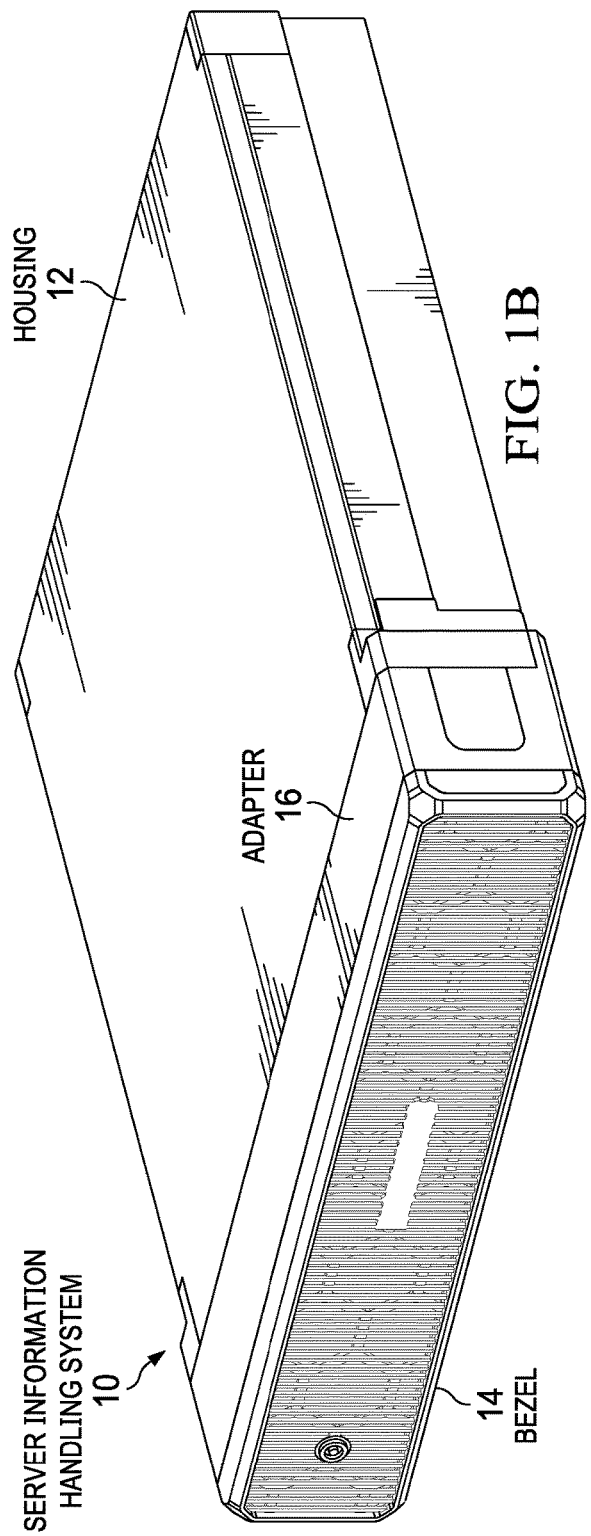

Referring now to FIGS. 1A and 1B, a server information handling system 10 is depicted having a bezel 14 that secures either a front or rear face of the housing 12. In a server rack, information handling system 10 may mount with either the front or rear face exposed for access by service technicians. Cooling airflow through the housing 12 is provided from a cool side of the rack, such as where an HVAC system exhausts cooled and treated air for intake by information handling systems held in a server rack, and exhausted at a hot side of the rack, such as where the HVAC system intakes air for treatment and cooling. The direction of the cooling airflow is managed by cooling fans that operating in each housing 12. For instance, cooling fan rotation may reverse based upon the type of installation of an information handling system so that cooling airflow can enter from either a front or rear side of housing 12. In different data center scenarios, technicians may desire to have access from either a cooling aisle or heating aisle defined by the server racks.

In the example embodiment, FIG. 1A depicts a hot-aisle/rear accessed server with a bezel 14 coupled to the front face of the housing 12, and FIG. 1B depicts a cold-aisle/front accessed server with a bezel 14 coupled to the rear face of the housing 12. An adapter bezel extension 16 couples to the housing 12 to provide a cavity with room at bezel 14 for cables and ports to fit. For hot-aisle/rear accessed server information handling systems, the cables exit the rear of the system as mounted in the rack so that a short depth bezel fits at the front face of the information handling system. For cold-aisle/front accessed server information handling systems, the cables exit the front of the system as mounted in the rack so that a deep bezel mounts to the front of the system as mounted in the rack to provide space for ports and cables.

Figure 2A:
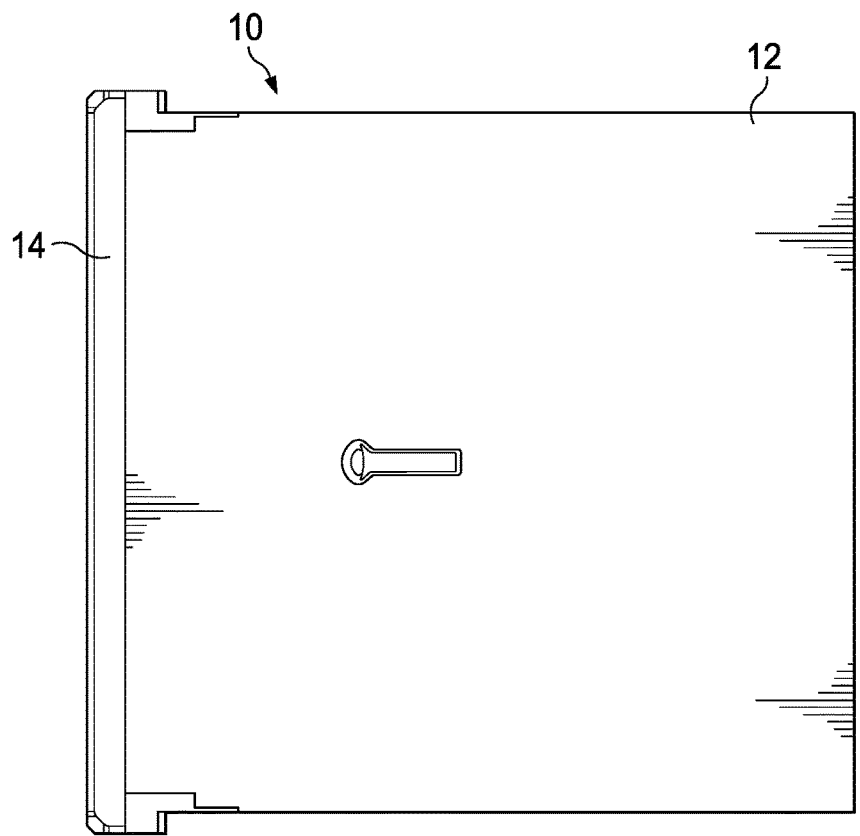
FIGS. 2A, 2B, 2C and 2D depict a top view of the server information handling system having the bezel securing either a front or rear face of the housing.
Figure 2B:
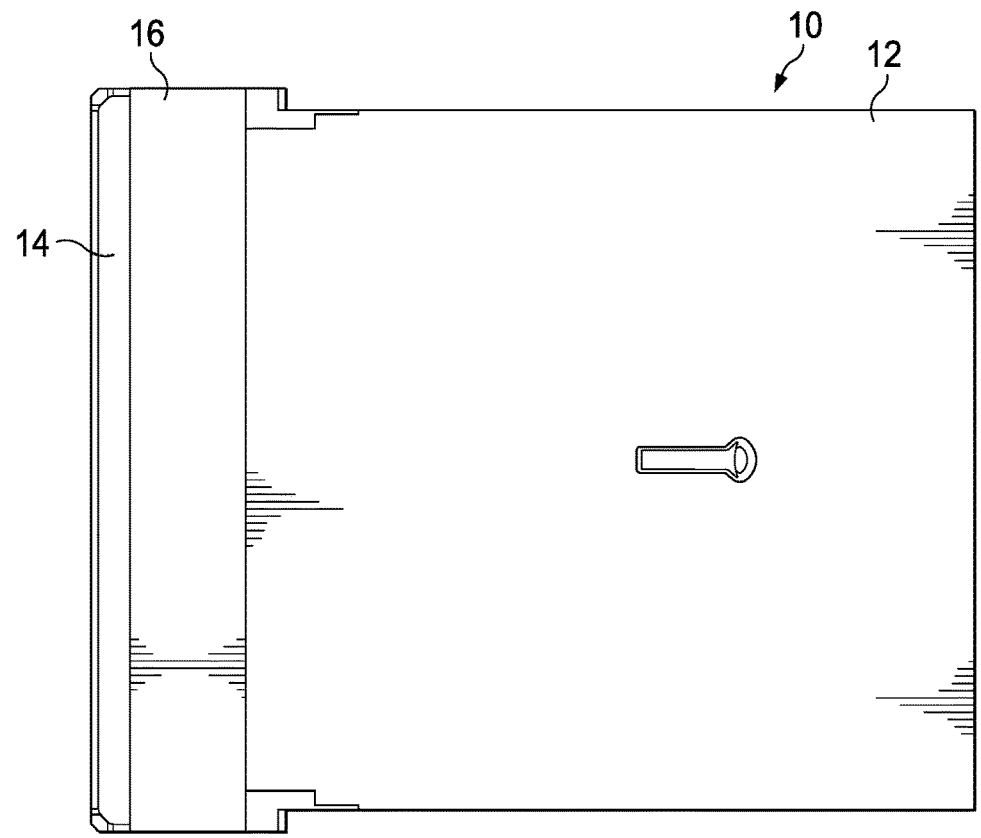
Figure 2C:
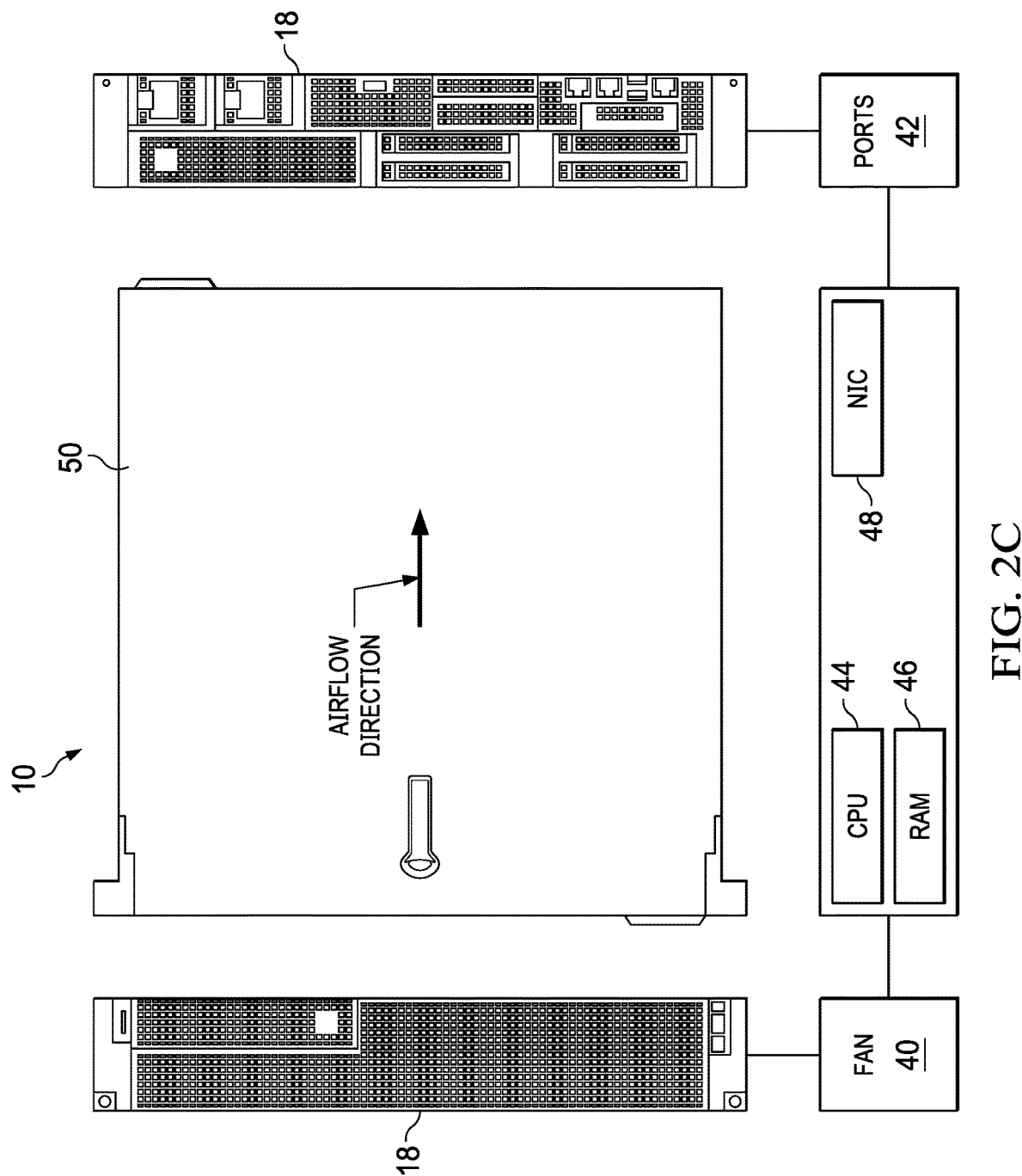
Figure 2D:
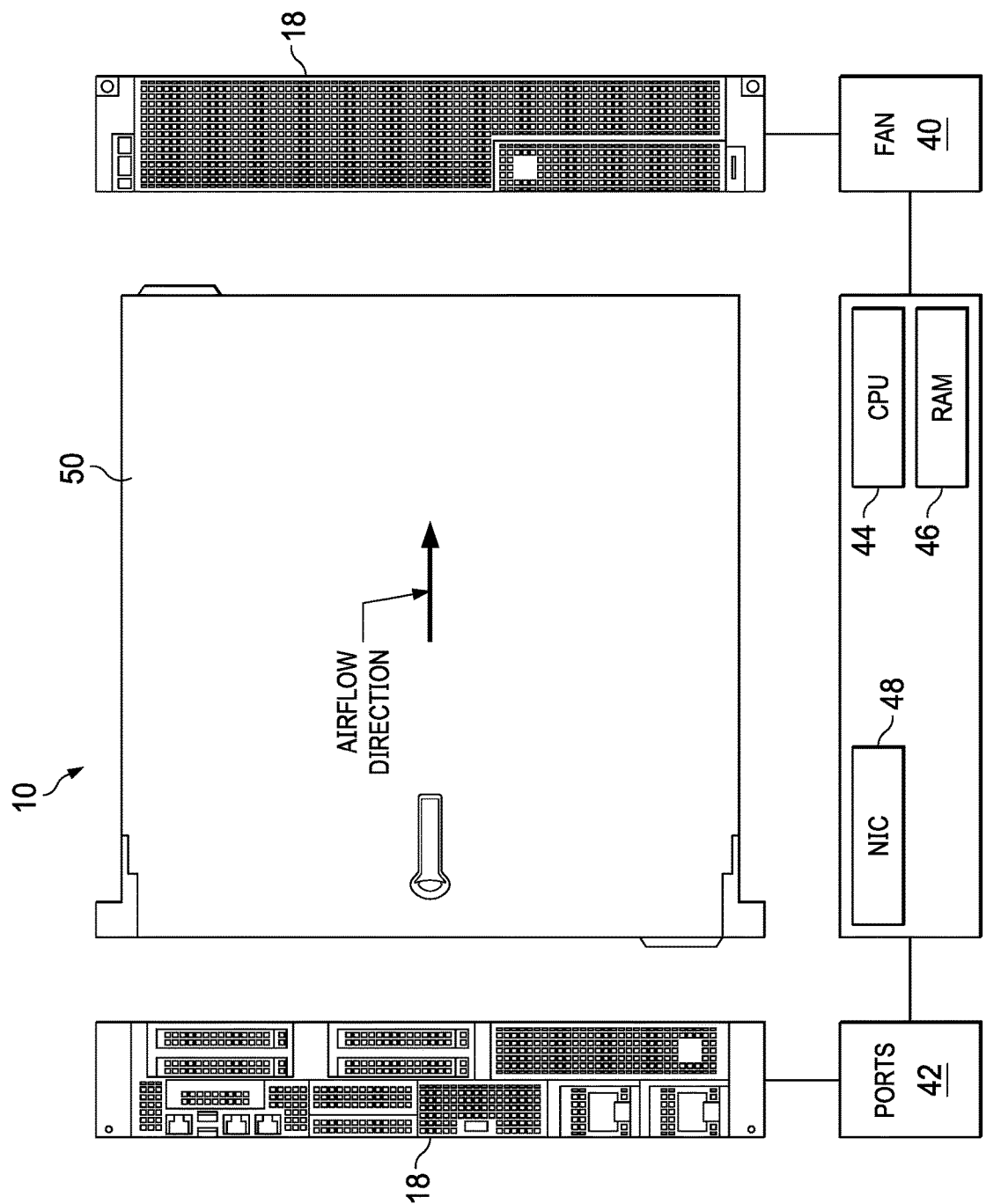

Referring now to FIGS. 2A, 2B, 2C and 2D, a top view depicts the server information handling system 10 having the bezel securing either a front or rear face of the housing 12. FIG. 2A depicts an example of a hot-aisle/rear accessed server information handling system 10 having bezel 14 attached directly to the housing 12. FIG. 2B depicts an example of a cold-aisle/front accessed server information handling system 10 having the adapter bezel extension 16 coupled directly to housing 12 with bezel 14 coupled directly to adapter bezel extension 16 and indirectly by the adapter to housing 12. The inclusion of adapter bezel extension 16 to housing 12 results in a greater overall system length and an interior cavity at adapter bezel extension 16 that provides room for inclusion of cables and ports. FIGS. 2C and 2D depict cooling airflow provided through housing 12 for the example server information handling systems of FIGS. 2A and 2B respectively. In FIG. 2C, the hot-aisle/rear accessed configuration has a vent 18 disposed along the entire front face that accepts cooling airflow as indicated by arrow 50 driven by cooling fan 40 through the housing and out a rear having vents 18 amongst cables and ports 42 that provide connections to internal components of information handling system 10. The example embodiment depicts a central processing unit (CPU) 44 that executes instructions to process information and a random access memory (RAM)

46 that stores the information and instructions. A network interface card (NIC) 48 communicates the information through ports 42.

FIG. 2D depicts server information handling system 10 with a cold-aisle/front accessed system having cables and ports 42 at front side of the server rack and the planar vent 18 at the rear side of the server rack. As is describe above, CPU 44, RAM 46 and NIC 48 cooperate to process information within server information handling system 10 and fans 40 provide a cooling airflow, such as by reversing the fan rotation direction. Cooling airflow 50 enters through the housing at a side with ports 42 to pass across the processing components and then exit at the planar vent 18 rear side. In the example embodiment, the configuration of FIG. 2C has a bezel directly coupled to server information handling system 10 with a short-depth bezel configuration as depicted by FIG. 2A; and the configuration of FIG. 2D has a bezel coupled to server information handling system 10 with an intervening adapter bezel extension having a cavity with interior space of cables and ports in a deep-bezel configuration as depicted by FIG. 2B.

Figure 3A:
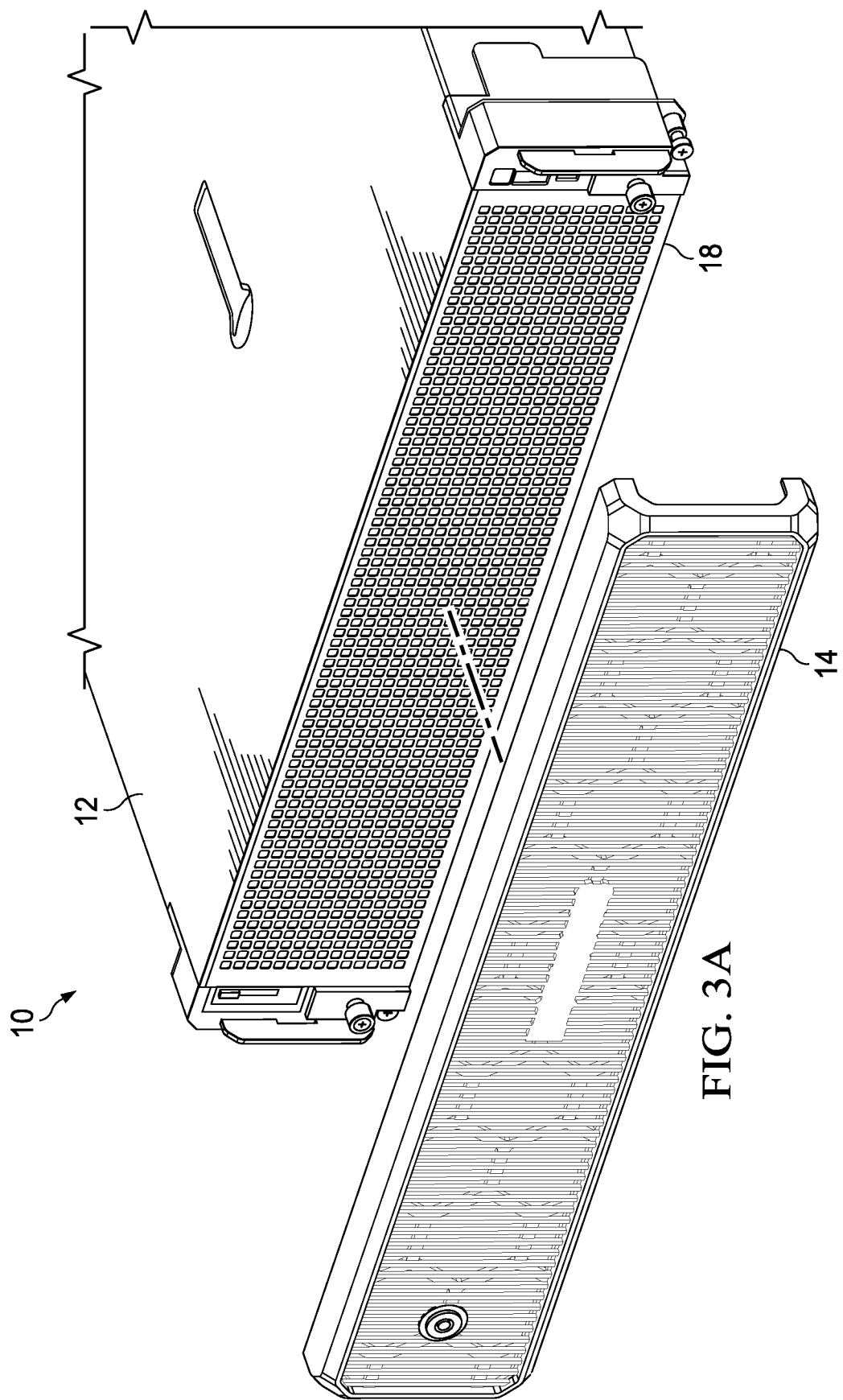
FIGS. 3A, 3B and 3C depict an exploded view of the bezel configured to secure either a front face or rear face of the server information handling system housing.
Figure 3B:
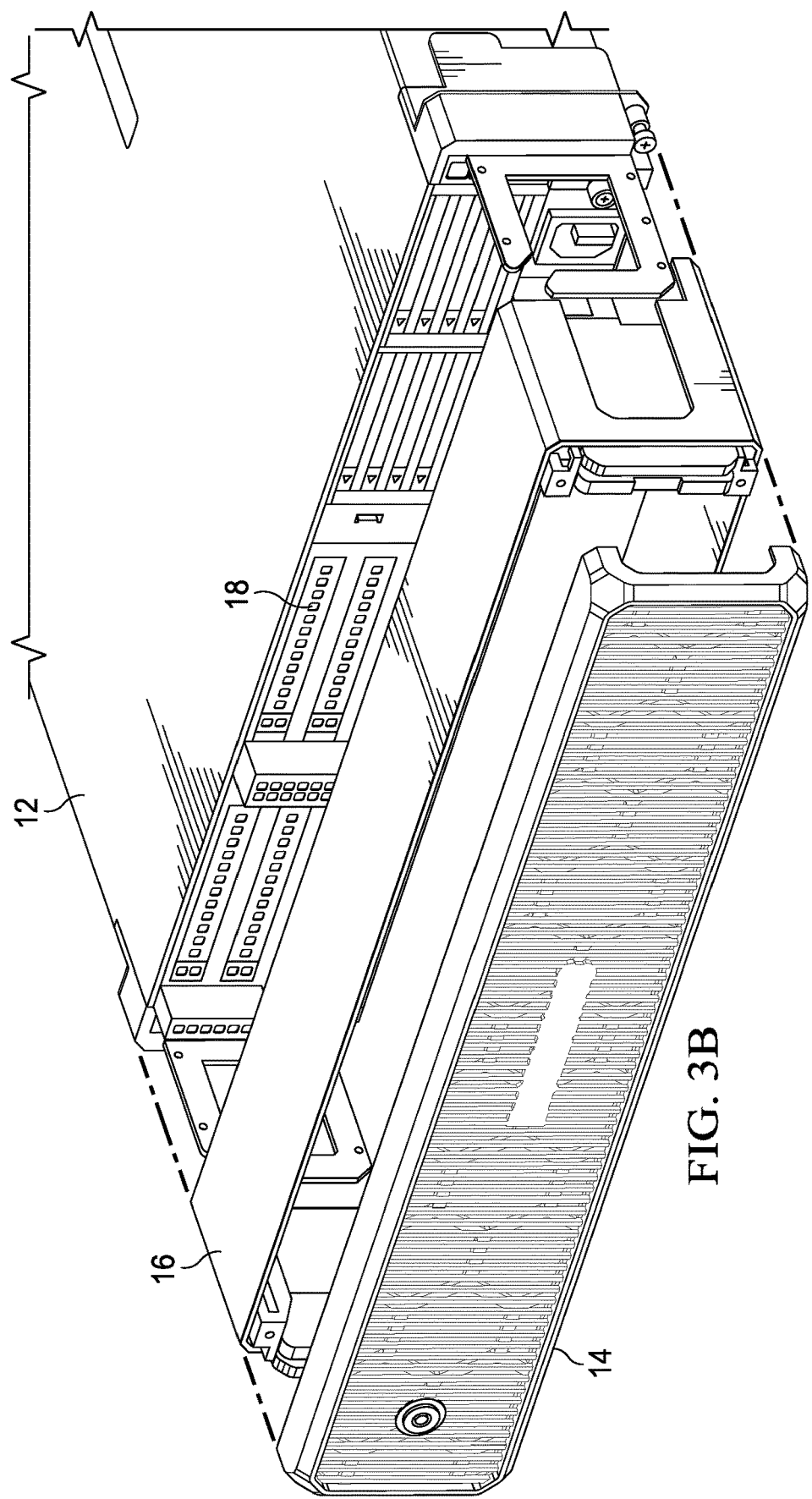
Figure 3C:
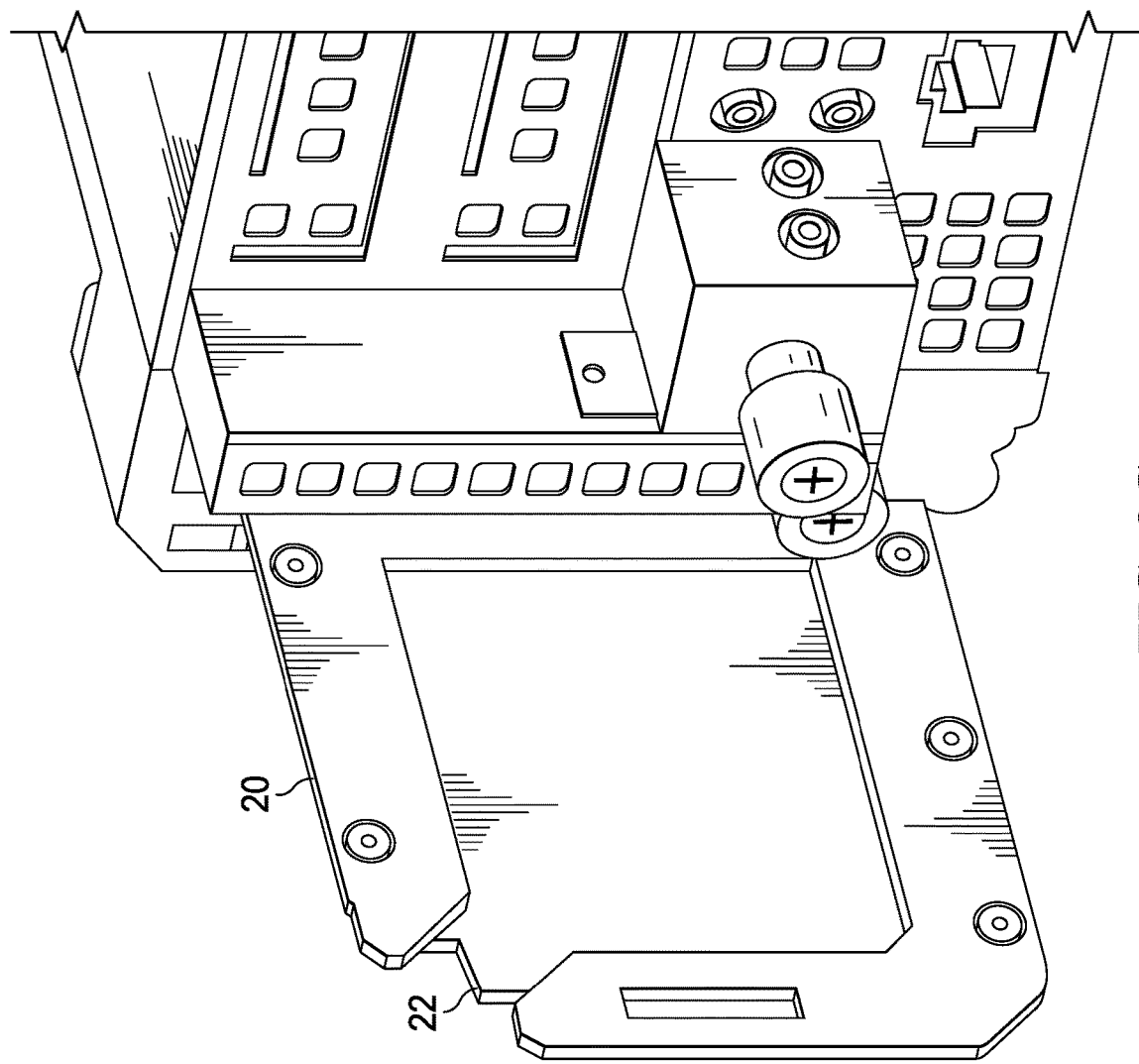

Referring now to FIGS. 3A, 3B and 3C, an exploded view depicts the bezel 14 configured to secure either a front face or rear face of the server information handling system housing 10. FIG. 3A depicts bezel 14 exploded away from a direct coupling to housing 12 at the planar vent 18 with the short-depth bezel configuration as depicted above by FIGS. 2A and 2C. FIG. 3B depicts bezel 14 exploded away from the port side of server information handling system 10 with an indirect coupling having an intermediary adapter bezel extension 16 that provides an interior cavity for the ports and cables. FIG. 3C depicts an example of a coupling device arm 20 that extends from housing 12 with a retractable coupling device hook 22 that couples with a press to an attached bezel 14 or adapter bezel extension 16. The length of coupling device arm 20 is adjusted to accept adapter bezel extension 16 when needed for coupling bezel 14 to the port side of the housing. Hook 22 is pressed to release adapter bezel extension 16 and is accessed from the interior cavity so that adapter bezel extension 16 remains securely coupled in place when bezel 14 is secured in place. Removal of adapter bezel extension 16 is restricted while bezel 14 remains in place to keep server information handling system 10 secure against unauthorized access. In the event of a change in orientation of server information handling system 10, adapter bezel extension 16 may be removed so that bezel 14 may couple directly to housing 12 at the planar vent end with the short-depth configuration.

Figure 4A:
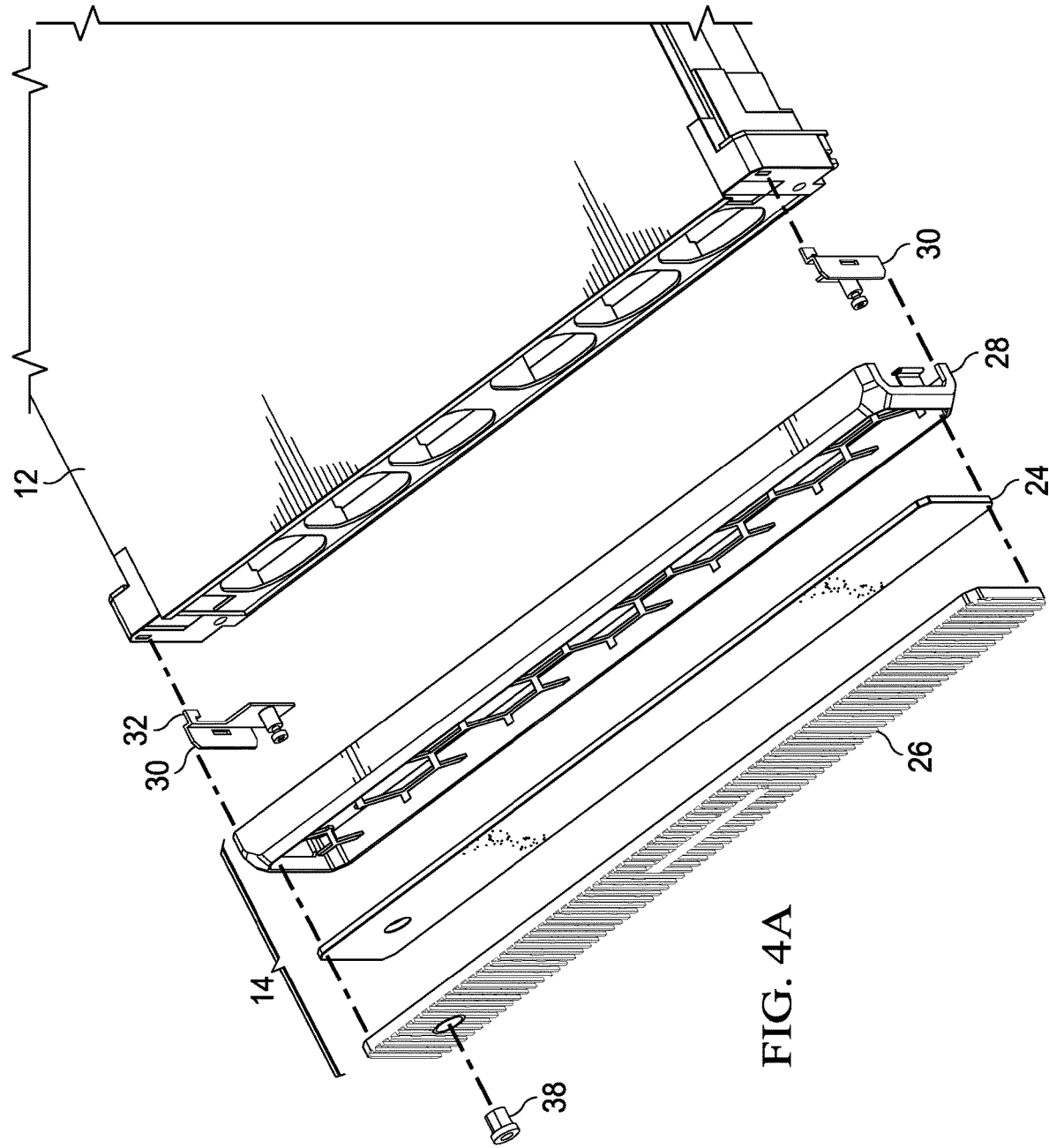
FIGS. 4A and 4B depict an exploded view of the bezel configured to secure the information handling system with a replaceable air filter.
Figure 4B:
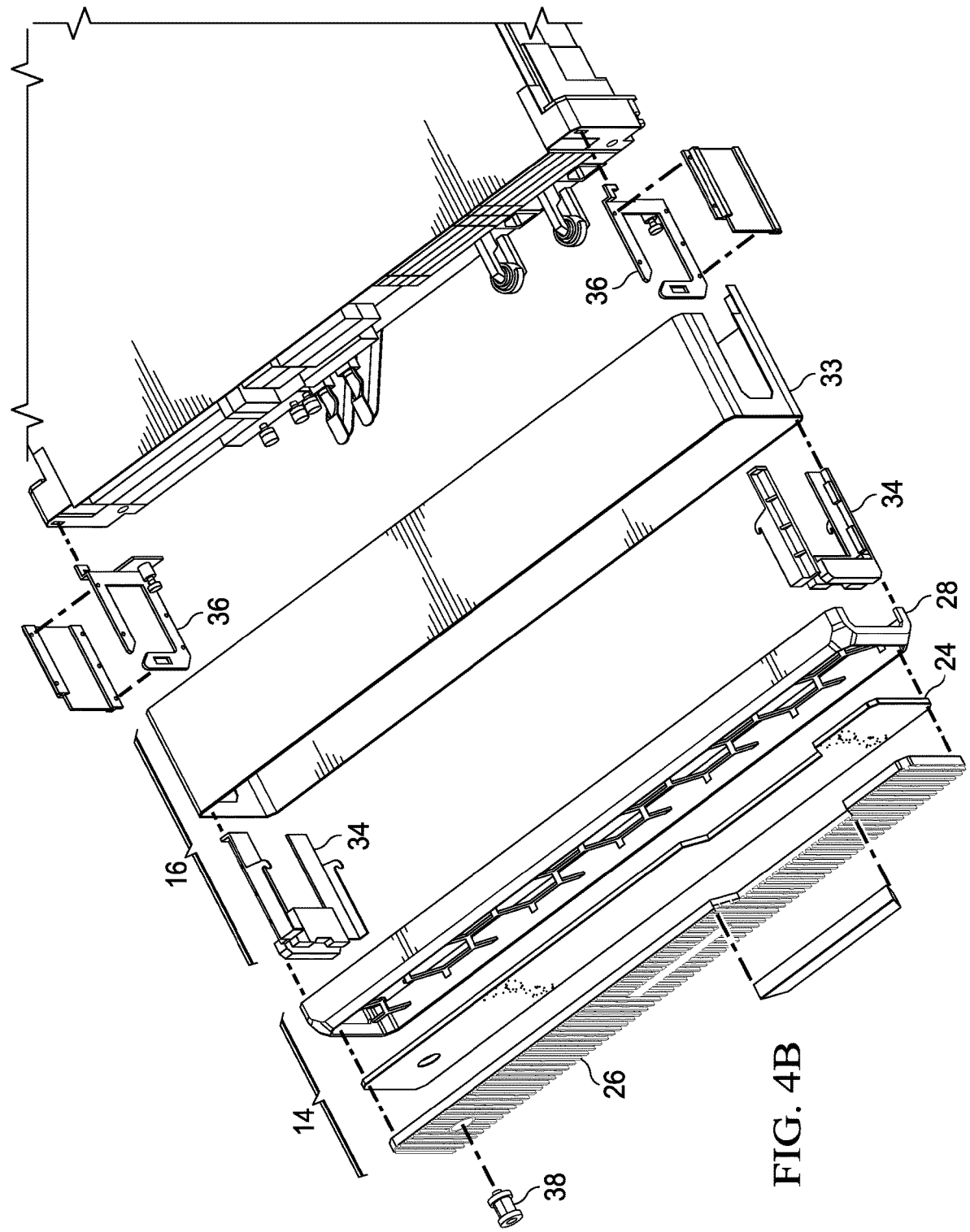

Referring now to FIGS. 4A and 4B, an exploded view depicts the bezel 14 configured to secure the information handling system 10 with a replaceable air filter 24. FIG. 4A depicts a short depth configuration having bezel 14 exploded out as three separate components, a security structure 28, a filter 24 and a filter brace 26. Security structure 28 couples to a housing brace 30 with a lock 38 so that housing brace 30 remains coupled to housing 12 with hooks 32 when security structure 28 is unlocked and separated from housing 12. Lock 38 is, for instance, a keyed lock and cylinder that rotates to release and secure security structure 28 from housing brace 30. Filter brace 26 snaps into security structure 28 over filter 24 to hold filter 24 in place. When filter 24 needs replacement, filter brace 26 is released to allow removal and replacement of filter 24. Replacement of filter 24 is accomplished while security structure 28 remains secured to housing 12, although a switch in lock 38 or a sensor in security structure 28 may detect access to and replacement of filter 24, such as for maintenance tracking purposes.

FIG. 4B depicts bezel 14 with a replaceable air filter 24 in a deep-bezel configuration having adapter bezel extension 16 interposed between security structure 28 and housing 12. In the example embodiment, filter brace 26 selectively attaches and detaches air filter 24 at the front face of security structure 28 as with the short-depth configuration of FIG. 4A so that air filter 24 may be changed while security structure 28 remains locked to secure housing 12 against access. Adapter bezel extension 16 has an extension housing 33 with an extended housing brace 36 that slidingly engages with a coupler 34 engaged at the interior side of the cavity defined by extension housing 33. Coupler 34 has an outer face that engages with security structure 28 of bezel 14 to lock and unlock with lock 38. Extension housing 33 with coupler 34 assembled at the interior cavity slides over extended housing brace 36 and release with an actuation located interior to extension housing 33 so that security structure 28 when coupled to coupling device 34 secures against access to the interior of extension housing 33, thereby restricting removal of adapter bezel extension 16 unless lock 38 is released.

Figure 5A:
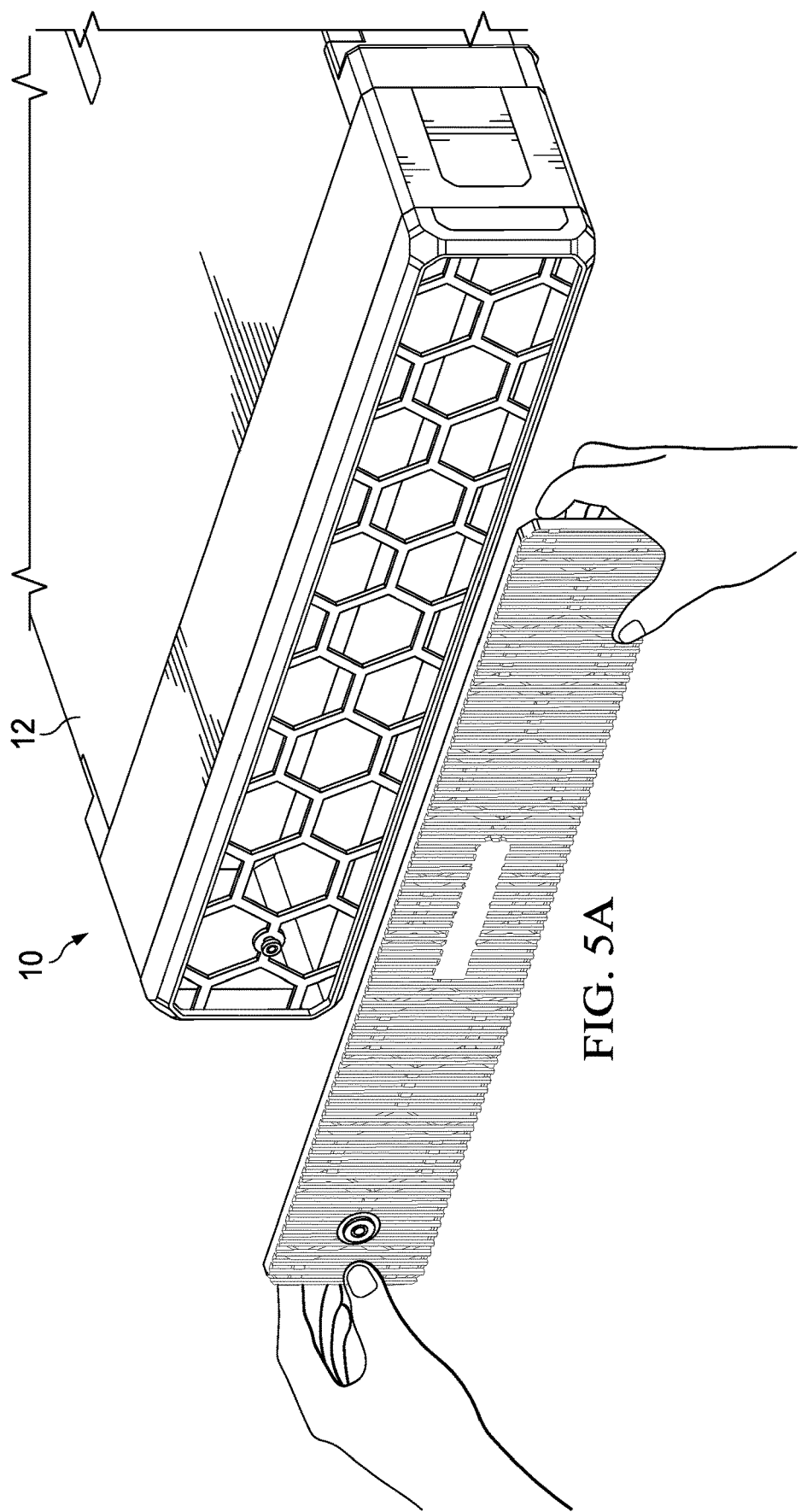
FIGS. 5A and 5B depicts replacement of an air filter with a bezel securing a server information handling system access location.
Figure 5B:
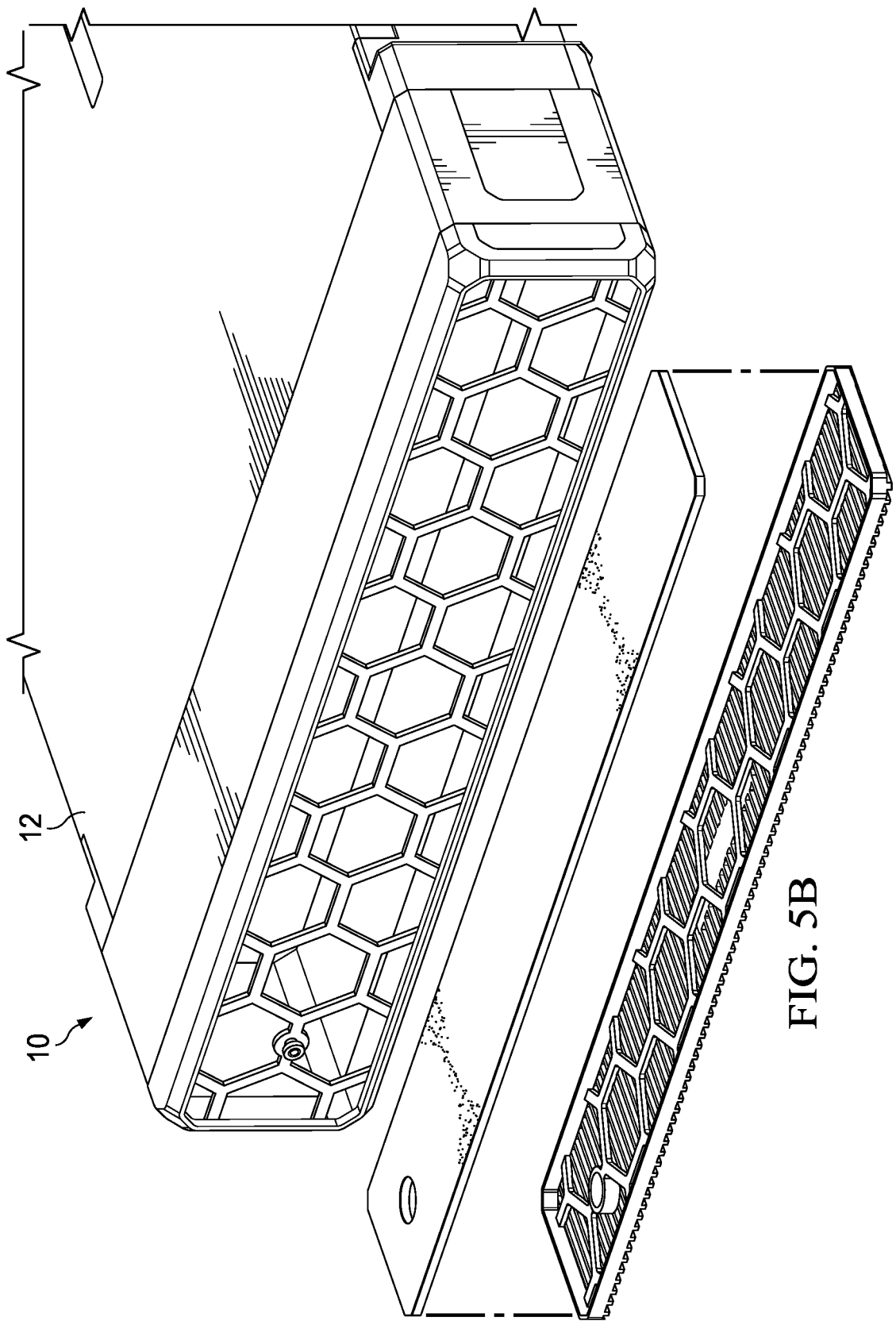

Referring now to FIGS. 5A and 5B, replacement of an air filter 24 is depicted while a bezel 14 secures a server information handling system access location. FIG. 5A depicts filter brace 26 and filter 24 removed as an assembled unit from a security structure 28 that couples to an adapter bezel extension 16 to secure server information handling system 10 when the port and cable end of the system is the access point for access to the interior of housing 12. An opening formed in filter 24 and filter brace 26 allows the filter brace assembly to fit onto and off of security structure 28 with the lock secured. FIG. 5B depicts separation of air filter 24 from filter brace 26 so that a replacement filter may couple into place. In the example embodiment, if a filter is not desired, server information handling system 10 may operate with just security structure 28 in place to prevent access to the housing interior. Security structure 28 has a geometric pattern formed in its front surface of a series of octagons. To match the appearance of the geometric pattern when an air filter is in place, filter brace 26 may include a matching geometric pattern that aligns with the security structure 28 geometric pattern when coupled in place. As another alternative, the geometric pattern may be painted or etched onto filter 24 to align with the geometric pattern of security structure 28. In alternative embodiments, alternative geometric shapes may be used.

Although the present invention has been described in detail, it should be understood that various changes, substitutions and alterations can be made hereto without departing from the spirit and scope of the invention as defined by the appended claims.

What is claimed is:

1. An information handling system comprising:
  a housing having a front face and a rear face, the front and rear faces having air vent openings to pass a cooling airflow through the housing;
  a processor disposed in the housing and operable to execute instructions to process information;
  a memory disposed in the housing and interfaced with the processor, the memory operable to store the instructions and information; and
  a bezel having a bezel lock coupled in a security structure, the security structure having a frame that extends across an opening of an access location, the bezel configured to secure against access to the housing when the bezel couples to the access location at the front face or the rear face and the bezel lock is in a locked position, the bezel selectively coupling directly to the front face to secure against access at the front face when the front face is the access location and the bezel lock is in the locked position;
a bezel extension configured to couple to the rear face, the bezel selectively coupling to the bezel extension when the rear face is the access location and the bezel extension couples to the rear face, to lock the bezel lock to secure against access at the rear face when the bezel lock is in the locked position;
an air filter disposed at the security structure to filter air that passes through the housing; and
a filter brace coupled to the security structure to capture the air filter, the filter brace selectively attached and detached from the security structure when the security structure locks access to the housing.

2. The information handling system of claim 1 further comprising:
a bezel extension coupling device configured to attach and detach the bezel extension at the rear face within the interior of the bezel extension;
wherein the bezel couples to the bezel extension to restrict access to both the bezel extension coupling device and the rear face.

3. The information handling system of claim 2 further comprising:
a planar vent at the front face;
wherein the bezel extension defines a cavity when the bezel couples at the rear face.

4. The information handling system of claim 3 wherein the bezel extension coupling device comprises a member at each opposing side of the rear face extending out with a retractable hook configured to engage the bezel extension at an interior and selectively released by a press from the interior.

5. The information handling system of claim 2 further comprising a keyed lock exposed at the bezel exterior and configured to couple with the housing to secure the bezel to the housing.

6. The information handling system of claim 1 further comprising:
a lock integrated with the bezel security structure and exposed at the bezel security structure exterior;
wherein the filter brace and filter have an opening configured to fit over and slide off the lock.

7. The information handling system of claim 1 further comprising:
a geometric pattern formed in the security structure; and
the geometric pattern formed in the filter brace and aligned with the geometric pattern of the security structure.

8. The information handling system of claim 1 further comprising:
a geometric pattern formed in the security structure; and
the geometric pattern formed in the filter and aligned with the geometric pattern of the security structure.

9. A server information handling system bezel comprising:
a bezel security structure having a lock coupled in a frame, the frame configured to secure across an information handling system access location so that engagement of the lock secures against access to the information handling system when the lock is in a locked position, the access location at a front face when the information handling system couples to a rack with a rear face at a rear side of the rack, the access location at a rear face when the information handling system couples to the rack with the front face at the rear side of the rack;
a bezel extension having an interior and a coupling device, the bezel extension selectively coupling to the rear face of the information handling system when the access location is the rear face;
an air filter sized to fit across a venting area of the security structure; and
a filter brace configured to couple to the security structure to capture the air filter against the security structure, the filter brace attachable and detachable at the security structure when the security structure restricts access to the information handling system;
wherein the bezel security structure couples directly to the information handling system when the access location is at the front face of the information handling system and couples to the bezel extension when the access location is at the rear face of information handling system.

10. The server information handling system bezel of claim 9 wherein the bezel extension coupling device is disposed in an interior of the bezel extension and secured against removal by the bezel security structure.

\* \* \* \* \*